(12) United States Patent
Wang et al.

(10) Patent No.: US 9,948,265 B2
(45) Date of Patent: Apr. 17, 2018

(54) INDUCTOR CAPACITOR TANK FOR RESONATOR

(71) Applicant: MEDIATEK INC., Hsin-Chu (TW)

(72) Inventors: Kun-Yin Wang, Tainan (TW); Wei-Hao Chiu, Taichung (TW); Ang-Sheng Lin, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 82 days.

(21) Appl. No.: 15/050,436

(22) Filed: Feb. 22, 2016

(65) Prior Publication Data
US 2016/0336914 A1 Nov. 17, 2016

Related U.S. Application Data

(60) Provisional application No. 62/161,850, filed on May 14, 2015.

(51) Int. Cl.
| H03H 7/01 | (2006.01) |
| H03H 5/12 | (2006.01) |
| H01F 17/00 | (2006.01) |

(52) U.S. Cl.
CPC ............ *H03H 7/0115* (2013.01); *H03H 5/12* (2013.01); *H01F 17/0006* (2013.01); *H01F 2017/0073* (2013.01)

(58) Field of Classification Search
CPC ........ H01F 17/0006; H01F 2017/0073; H03H 5/12; H03H 7/0115
USPC .......................................................... 333/174
See application file for complete search history.

(56) References Cited

U.S. PATENT DOCUMENTS

| 9,118,335 | B2 | 8/2015 | Wu | |
| 9,276,547 | B2* | 3/2016 | Wang | H03H 7/0115 |
| 9,313,053 | B2* | 4/2016 | Kaunisto | H03H 7/0115 |
| 9,667,217 | B2* | 5/2017 | Cheng | H03H 7/38 |
| 2010/0052817 | A1 | 3/2010 | Fan | |
| 2012/0169433 | A1* | 7/2012 | Mullins | H03H 7/0115 |
| | | | | 333/181 |
| 2014/0285299 | A1 | 9/2014 | Bojer | |

(Continued)

FOREIGN PATENT DOCUMENTS

| EP | 1 858 155 A1 | 11/2007 |
| EP | 2 355 340 A1 | 8/2011 |

OTHER PUBLICATIONS

R. Staszewski et al., "A Digitally Controlled Oscillator in a 90nm Digital CMOS Process for Mobile Phones", IEEE J. Solid-State Circuits, vol. 40, No. 11, pp. 2203-2211, Nov. 2005.

(Continued)

*Primary Examiner* — Dean Takaoka
*Assistant Examiner* — Alan Wong
(74) *Attorney, Agent, or Firm* — Winston Hsu

(57) ABSTRACT

An inductor capacitor (LC) tank includes a first inductor and a first tunable capacitive array. The first inductor has a first terminal and a second terminal, and the first tunable capacitive array has a first terminal and a second terminal. The first tunable capacitive array is at a path branching from a first point between the first terminal and the second terminal of the first inductor, the first terminal of the first tunable capacitive array is coupled to the first point, and the second terminal of the first tunable capacitive array and the second terminal of the first inductor are coupled to a reference voltage.

29 Claims, 11 Drawing Sheets

(56) References Cited

U.S. PATENT DOCUMENTS

2015/0097637 A1* 4/2015 Pye .................. H03H 11/04
333/174

OTHER PUBLICATIONS

Y. Chen et al., "A 9GHz Dual-Mode Digitally Controlled Oscillator for GSM/UMTS Transceivers in 65nm CMOS", IEEE Asian Solid-State Circuits Conference (ASSCC '07), pp. 432-435, Nov. 2007.

L. Fanori et al., "3.3 GHz DCO with a Frequency Resolution of 150Hz for All-Digital PLL", ISSCC Dig. Tech. Papers, pp. 48-49 and Figure 2.6.7, Feb. 2010.

Wanghua Wu et al., "High-Resolution Millimeter-Wave Digitally Controlled Oscillators With Reconfigurable Passive Resonators", IEEE J. Solid-State Circuits, vol. 48, No. 11, pp. 2785-2794, Nov. 2013.

* cited by examiner

INDUCTOR CAPACITOR TANK FOR RESONATOR

CROSS REFERENCE TO RELATED APPLICATIONS

This application claims the benefit of U.S. Provisional Application No. 62/161,850, which was filed on May 14, 2015, and is included herein by reference.

BACKGROUND

The disclosed embodiments of the present invention relate to circuit design, and more particularly, to an inductor capacitor (LC) tank for a resonator.

In designing a coil-based LC tank for a resonator set, such as an LC voltage-controlled oscillator (VCO) or an LC digital-controlled oscillator (DCO), variations in the semiconductor manufacturing process is always a concern. Over the years, a number of designs have been used to improve the yield rate. Some of these schemes suffer from component variations, and others are difficult to be controlled since the behavior of frequency fine-tuning is not a linear curve.

Important questions in this field are how to design an LC tank which has immunity to process variation that can also be accurately tuned and efficiently calibrated.

SUMMARY

One of the objectives of the present invention is therefore to design an LC tank for a resonator that can solve the prior art issues.

According to a first aspect of the invention, an inductor capacitor (LC) tank is disclosed. The LC tank includes a first inductor and a first tunable capacitive array. The first inductor has a first terminal and a second terminal, and the first tunable capacitive array has a first terminal and a second terminal. The first tunable capacitive array that may comprise a plurality of tunable capacitive units which are independently controllable (e.g. the tunable capacitive units can be independently controlled) is at a path branching from a first point between the first terminal and the second terminal of the first inductor, the first terminal of the first tunable capacitive array is coupled to the first point, and the second terminal of the first tunable capacitive array and the second terminal of the first inductor are coupled to a reference voltage.

According to a second aspect of the invention, an inductor capacitor (LC) tank is disclosed. The LC tank includes a first inductor, a second inductor and a tunable capacitive array. The first inductor has a first terminal and a second terminal. The second inductor has a first terminal and a second terminal. The tunable capacitive array has a first terminal and a second terminal. The tunable capacitive array is at a path branching from a first point between the first terminal and the second terminal of the first inductor to a second point between the first terminal and the second terminal of the second inductor, the first terminal of the tunable capacitive array is coupled to the first point, and the second terminal of the tunable capacitive array is coupled to the second point.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
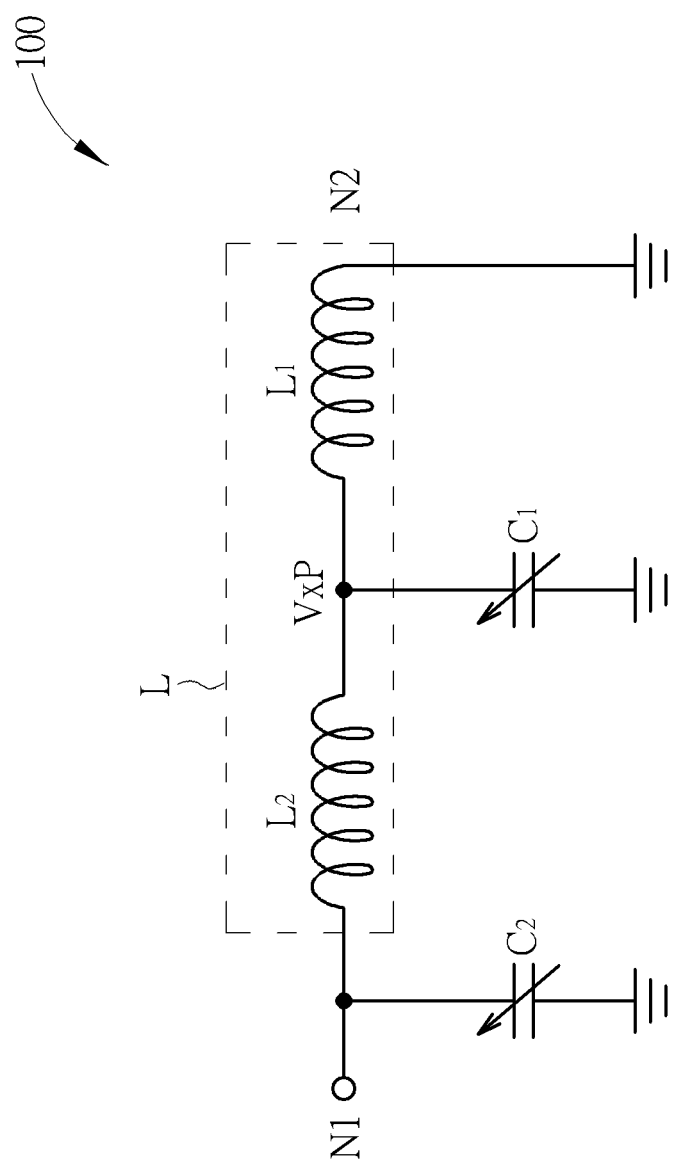
FIG. 1 is a diagram illustrating an inductor capacitor (LC) tank according to a first embodiment of the present invention.

FIG. 1 is a diagram illustrating an LC tank according to a first embodiment of the present invention. The single-ended multi-order LC tank 100 comprises an inductor L and switchable capacitive elements $C_1$ and $C_2$. Specifically, capacitor devices may be placed in each switchable capacitive element of the switchable capacitive elements $C_1$ and $C_2$. The capacitor devices can be switched on or off via switches depending on a provided data word. Note that the number of devices is not limited in this invention. Moreover, the switchable capacitive elements C1 and C2 may be replaced by analog tunable capacitors of other designs. The switchable capacitive element $C_2$ is coupled between a terminal N1 of the inductor L and a reference voltage, e.g. a ground voltage. The switchable capacitive element $C_1$ is coupled between a point V×P on the inductor L and the reference voltage, wherein the point V×P may be arbitrarily selected according to design specifications, and the inductor L is separated into two series sub-inductors $L_1$ and $L_2$. Note that an inductance (hereinafter, L) of the inductor L equals the sum of the inductances (hereinafter, $L_1$ and $L_2$) of the inductors $L_1$ and $L_2$. In practice, the point V×P may be any point on the inductor L other than the terminal N1 and another terminal N2. Preferably $L_1$ is smaller than $L_2$; however, $L_1<L_2$ is not a limitation of the invention. The terminal N2 is coupled to the reference voltage.

The LC tank 100 is capable of operating with different system standards by controlling the switchable capacitive element $C_2$, although this may be an optional feature in some applications. Hence, the switchable capacitive element $C_2$ is not essential to the invention. The concept of the invention is to use the switchable capacitive element $C_1$ to tune the LC tank 100 by a certain frequency step size; the advantages are described later. When the capacitance (hereinafter, $C_2$) of the switchable capacitive element $C_2$ is greater than the capacitance (hereinafter, $C_1$) of $C_1$, the oscillation frequency $f_{osc}$ can be represented as follows:

$$f_{osc} = \frac{1}{2\pi}\sqrt{\frac{\frac{1}{2C_1L_1}+\frac{1}{2C_1L_2}+\frac{1}{2C_2L_2}-\sqrt{(C_1L_1+C_2L_1+C_2L_2)^2-4C_1C_2L_1L_2}}{2C_1C_2L_1L_2}} \quad (1)$$

Wherein, the oscillation frequency $f_{osc}$ is not sensitive to a unit adjustment $\Delta C_1$ of the switchable capacitive element $C_1$, since the impedance obtained by looking into the point V×P is less than the impedance obtained by looking into the terminal N1.

If $L_1=\alpha L$ and $L_2=(1-\alpha)L$, then a ratio of a differentiation of the oscillation frequency $f_{osc}$ with respect to $C_1$ to a differentiation of the oscillation frequency $f_{osc}$ with respect to $C_2$ will be obtained:

$$\frac{\partial f_{osc}}{\partial C_1} \bigg/ \frac{\partial f_{osc}}{\partial C_2} = \frac{-C_2^2[\alpha(2\alpha-1)C_1+C_2-Q]}{\alpha C_1^2[C_2(1-2\alpha)-\alpha C_1+Q]} \quad (2)$$

Wherein $$Q=\sqrt{C_2^2-2\alpha C_1C_2+\alpha^2 C_1(C_1+4C_2)} \quad (3)$$

If $C_1 \ll C_2$ or $\alpha \ll 1$, then it can be determined that:

$$\frac{\partial f_{osc}}{\partial C_1} \bigg/ \frac{\partial f_{osc}}{\partial C_2} = \alpha^2 \quad (4)$$

Figure 2:
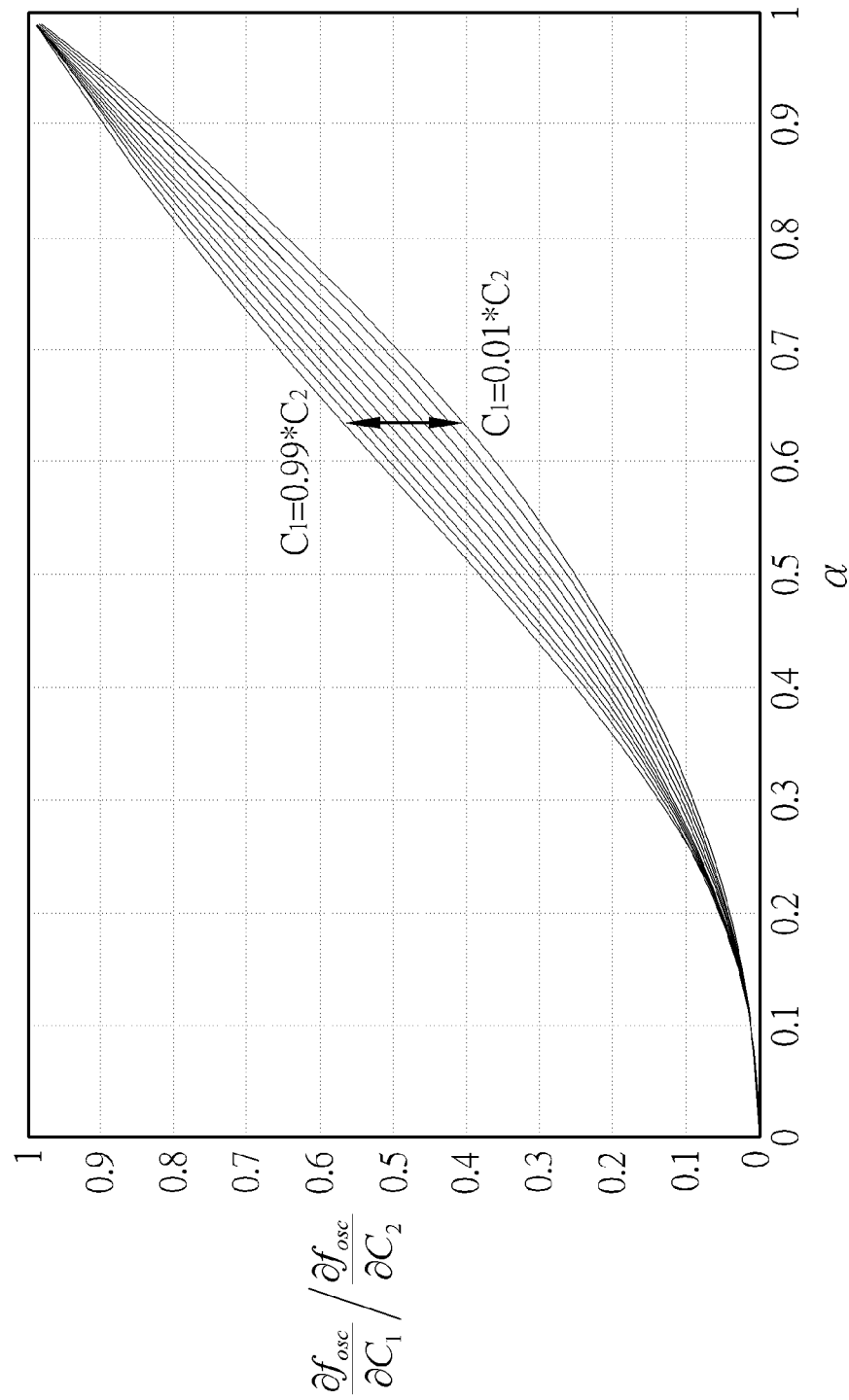
FIG. 2 is a chart illustrating a difference of oscillation frequency to $C_1$ over a difference of oscillation frequency to $C_2$ versus $\alpha$.

FIG. 2 is a chart illustrating a difference of oscillation frequency $f_{osc}$ to $C_1$ over a difference of oscillation frequency $f_{osc}$ to $C_2$ versus $\alpha$. As shown in the figure, when $\alpha$ is small, $$\frac{\partial f_{osc}}{\partial C_1} \bigg/ \frac{\partial f_{osc}}{\partial C_2}$$

will become small even if $C_1=C_2$. Thus the switchable capacitive element $C_2$ is not limited to be of a small size: this is a major advantage of the invention, since variations in the semiconductor manufacturing process become more critical with a small sized capacitive element than with a larger one.

TABLE 1

| α | $C_1/C_2$ | simulated $\frac{\partial f_{osc}}{\partial C_1} \bigg/ \frac{\partial f_{osc}}{\partial C_2}$ | calculated $\frac{\partial f_{osc}}{\partial C_1} \bigg/ \frac{\partial f_{osc}}{\partial C_2}$ |
|---|---|---|---|
| 0.5 | 0.2 | 0.270 | 0.276 |
| 0.5 | 1 | 0.369 | 0.381 |
| 0.125 | 0.2 | 0.0183 | 0.0163 |
| 0.125 | 1 | 0.0215 | 0.0196 |

In Table 1 shown above, different $$\frac{\partial f_{osc}}{\partial C_1} \bigg/ \frac{\partial f_{osc}}{\partial C_2}$$

values obtained by different α and $C_1/C_2$ are shown. If a small frequency step size is required, a preferable implementation may be to dispose the switchable capacitive element $C_2$ at the point V×P corresponding to α=0.125 instead of shrinking the size of the switchable capacitive element $C_2$. In this way, the design can become easier and the predicted result can be closer to the real result since the LC tank 100 has a better immunity to device variations.

Figure 3:
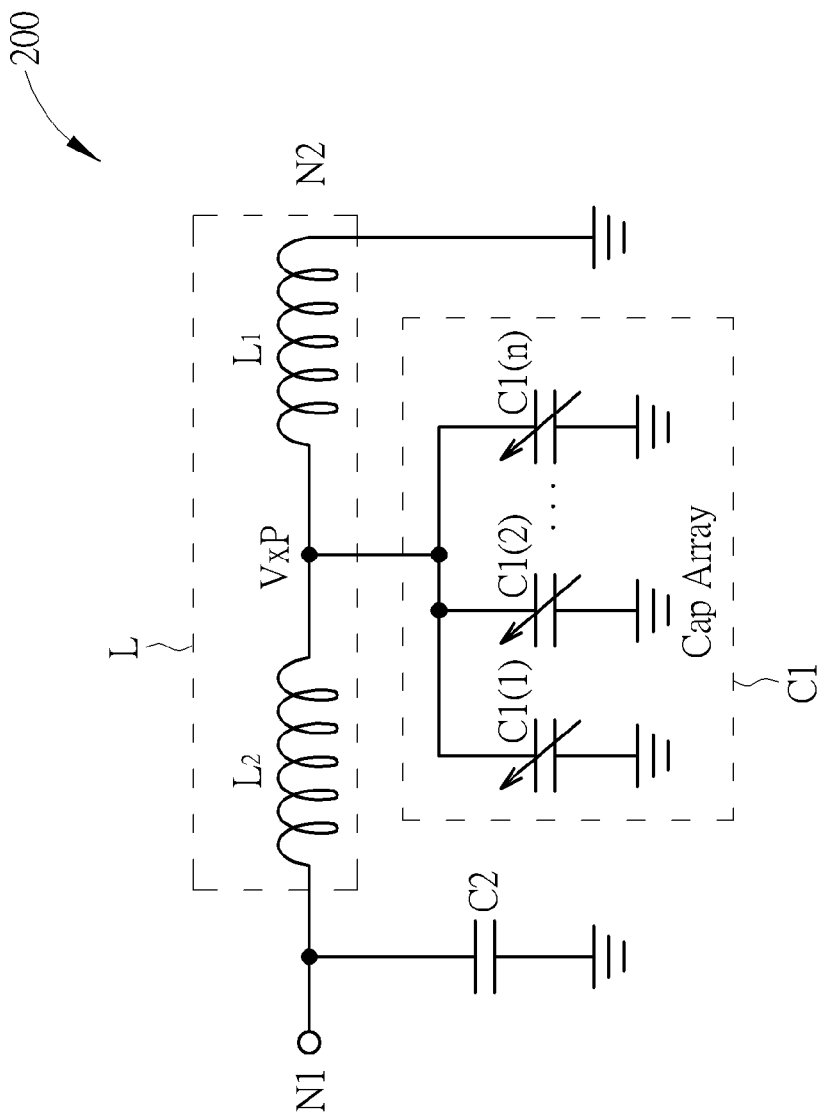
FIG. 3 is a diagram illustrating an LC tank according to another embodiment of the present invention.

FIG. 3 is a diagram illustrating an LC tank 200 according to another embodiment of the present invention. The LC tank 200 may comprise a portion of the components of the LC tank 100 shown in FIG. 1 and some of the associated connections in the LC tank 100. For example, the LC tank 200 may comprise the inductor L that may be separated into the two series sub-inductors $L_1$ and $L_2$. In addition, the LC tank 200 may further comprise a tunable capacitive array C1 and a capacitive element C2, where the tunable capacitive array C1 (labeled "Cap Array" in FIG. 3, for brevity) may comprise a plurality of tunable capacitive units which are independently controllable (e.g. the tunable capacitive units can be independently controlled). For example, each tunable capacitive unit of the plurality of tunable capacitive units can be a switchable capacitor unit, and therefore the tunable capacitive array C1 can be a switchable capacitor array.

As shown in FIG. 3, the tunable capacitive array C1 of this embodiment can be a capacitor array which is constructed by a plurality of switchable capacitor units C1(1), C1(2), . . . , and C1(n) (e.g. the notation "n" may represent a positive integer, such as a positive integer that is greater than one), wherein the capacitance of the switchable capacitor units C1(1), C1(2), . . . , and C1(n) can be controlled independently. In addition, the switchable capacitive element $C_2$ shown in FIG. 1 can be replaced by the capacitive element C2 in this embodiment, while the tunable capacitive array C1 of this embodiment can be taken as an example of the switchable capacitive elements $C_1$ shown in FIG. 1. In some embodiments (e.g. the embodiment shown in FIG. 3), if the tunable capacitive array C1 such as the aforementioned switchable capacitor array is designed to have identical switchable capacitor units, the delta frequency (e.g. the frequency difference) per unit capacitance change can be very uniform over the control codes.

Figure 4:
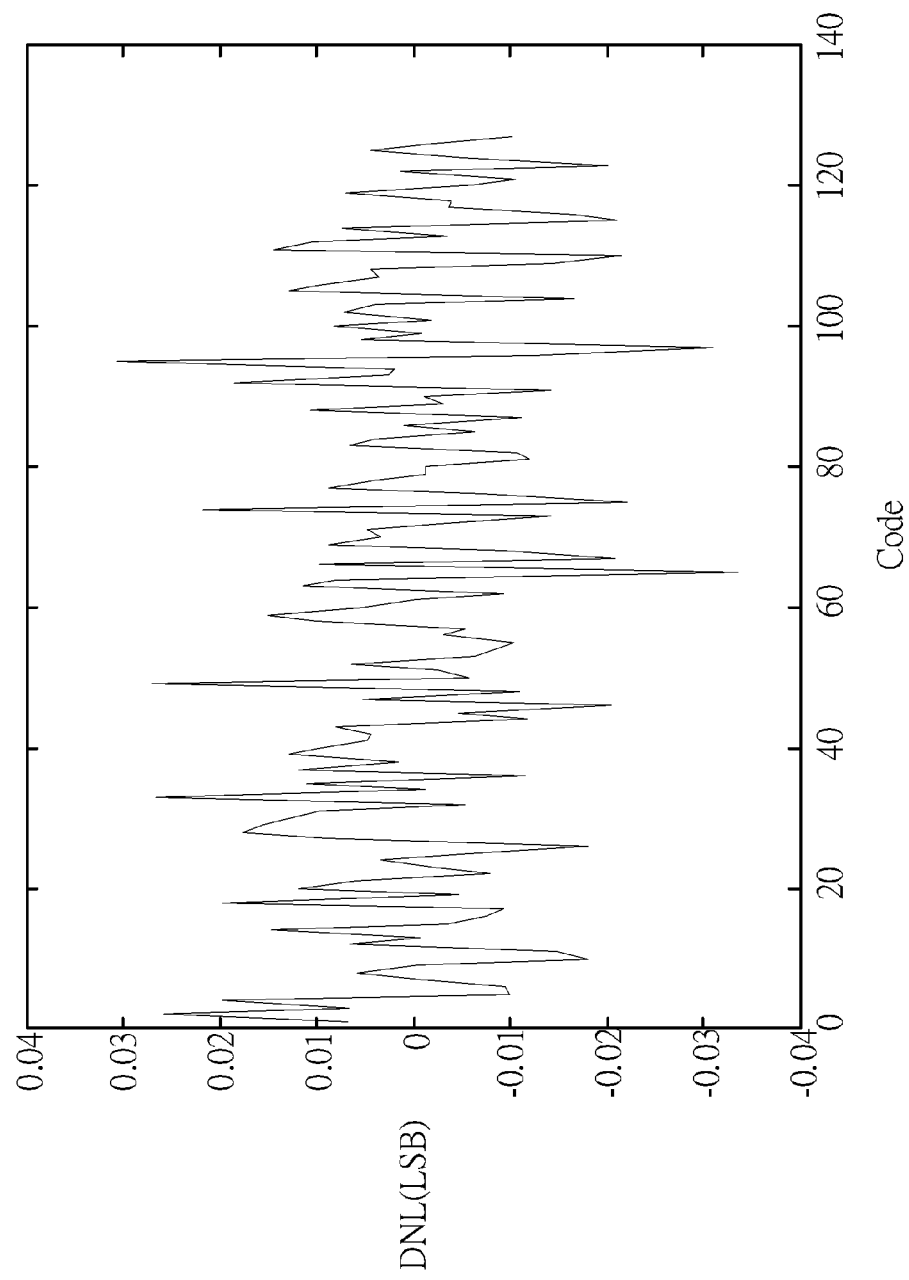
FIG. 4 illustrates a relationship between the differential non-linearity (DNL) and the control codes according to an embodiment of the present invention.

FIG. 4 illustrates a relationship between the differential non-linearity (labeled "DNL" in FIG. 4, for brevity) and the control codes (labeled "Code" in FIG. 4, for brevity) according to an embodiment of the present invention. As shown in FIG. 4, the differential non-linearity over the control codes can be as small as 0.05 LSB, i.e. 5% of the equivalent amount corresponding to the least significant bit (LSB).

Figure 5:
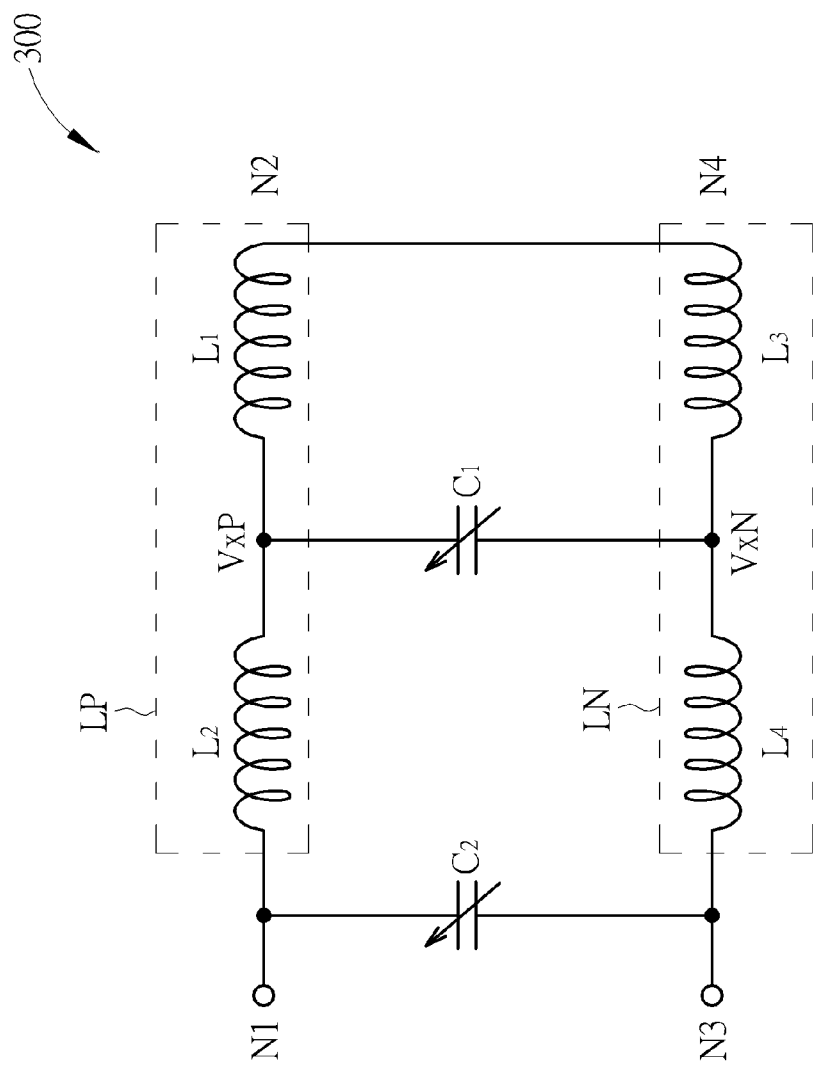
FIG. 5 is a diagram illustrating an LC tank according to a second embodiment of the present invention.

FIG. 5 is a diagram illustrating an LC tank according to a second embodiment of the present invention. The differential multi-order LC tank 300 comprises two inductors LP and LN and switchable capacitive elements $C_1$ and $C_2$. Specifically, capacitor devices may be placed in each switchable capacitive element $C_1$ and $C_2$. The capacitor devices can be switched on or off via switches depending on a provided data word. Note that the number of devices is not limited in this invention. Moreover, the switchable capacitive elements $C_1$ and $C_2$ may be replaced by analog capacitors in other designs. The switchable capacitive element $C_2$ is coupled between a terminal N1 of the inductor LP and a terminal N3 of the inductor LN. The switchable capacitive element $C_1$ is coupled between a point V×P on the inductor LP and a point V×N on the inductor LN, wherein the points V×P and V×N may be arbitrarily selected according to design specifications. The inductor LP is separated into two series sub-inductors $L_1$ and $L_2$ by the point V×P, and the inductor LN is separated into two series sub-inductors $L_3$ and $L_4$ by the point V×N. Note that an inductance (hereinafter, LP) of the inductor LP equals the sum of the inductances (hereinafter, $L_1$ and $L_2$) of the inductors $L_1$ and $L_2$; and an inductance (hereinafter, LN) of the inductor LN equals the sum of the inductances (hereinafter, $L_3$ and $L_4$) of the inductors $L_3$ and $L_4$. In practice, the point V×P may be any point on the inductor LP other than the terminal N1 and another terminal N2; the point V×N may be any point on the inductor LN other than the terminal N3 and another terminal N4. Preferably, $L_1$ is smaller than $L_2$, and $L_3$ is smaller than $L_4$; however, $L_1 < L_2$ and $L_3 < L_4$ is not a limitation of the invention. The terminal N2 is coupled to the terminal N4.

The LC tank 300 is capable of operating with different system standards by controlling the switchable capacitive element $C_2$, although this may be an optional feature in some applications. Hence, the switchable capacitive element $C_2$ is not essential to the invention. The concept of the LC tank 300 is similar to the LC tank 100 except that the LC tank 300 is for differential architecture. Those skilled in the art should readily understand the operation of the LC tank 300 after reading the descriptions pertaining to the LC tanks 100 and 200. Details are omitted here for brevity.

Figure 6:
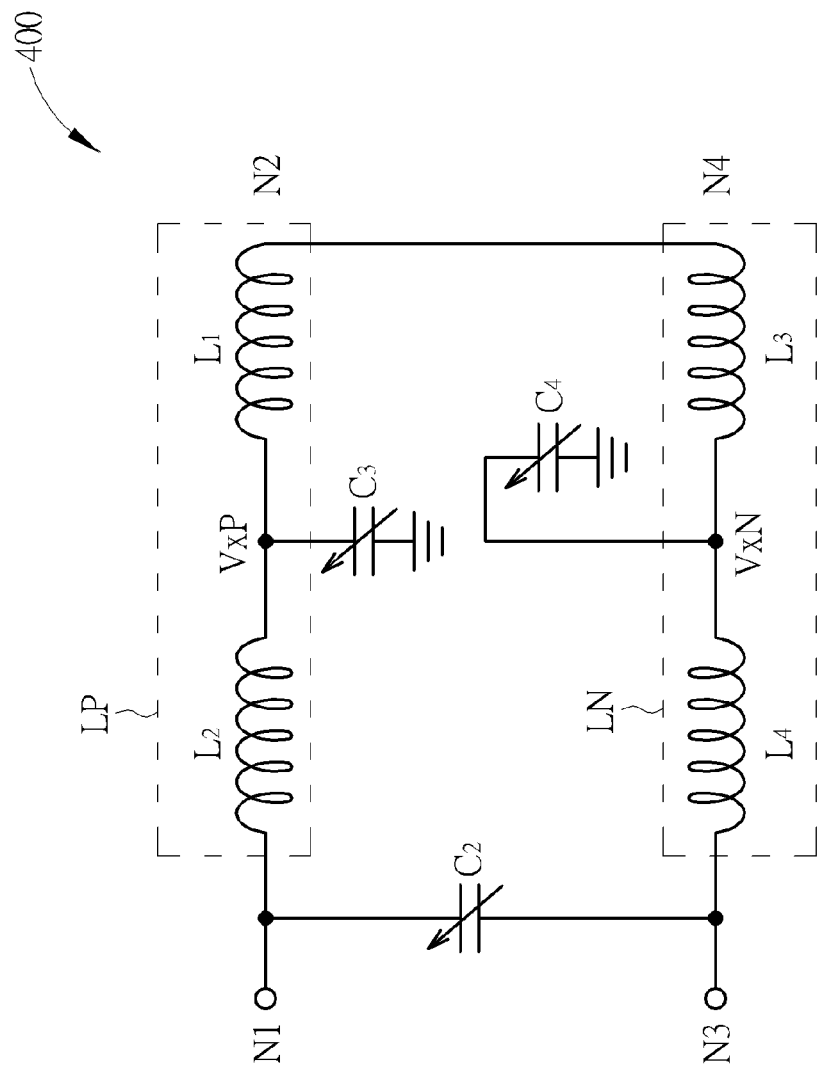
FIG. 6 is a diagram illustrating an LC tank according to a third embodiment of the present invention.

The switchable capacitive element $C_1$ of the LC tank 300 may be replaced by two switchable capacitive elements $C_3$ and $C_4$ as shown in FIG. 6 according to a third embodiment of the present invention. In FIG. 6, the switchable capacitive elements $C_3$ and $C_4$ can be adjusted independently. To put it another way, the LC tank 400 may be adjusted asymmetrically for certain usage, for instance, to offset the inherent mismatch of the LC tank 400. Those skilled in the art should readily understand the operation of the LC tank 400 after reading the descriptions regarding the LC tanks 100, 200, and 300. Details are omitted here for brevity.

According to some embodiments, implementation of the switchable capacitive element $C_2$ in the architecture shown in FIG. 6 may vary. For example, the switchable capacitive element $C_2$ of the LC tank 400 may be replaced by two switchable capacitive elements $C_5$ and $C_6$, and the associated connections of the two switchable capacitive elements $C_5$ and $C_6$ may be similar to that of the two switchable capacitive elements $C_3$ and $C_4$ shown in FIG. 6, respectively, e.g. the switchable capacitive element $C_5$ may be coupled between the terminal N1 and a reference voltage such as the ground voltage and the switchable capacitive element $C_6$ may be coupled between the terminal N3 and a reference voltage such as the ground voltage. This is for illustrative purposes only, and is not meant to be a limitation of the present invention. According to some other embodiments of the present invention, one of the switchable capacitive elements $C_5$ and $C_6$ may be removed from the LC tank of the above embodiments. According to some other embodiments of the present invention, the switchable capacitive element $C_2$ of the LC tank 400 may be replaced by the two switchable capacitive elements $C_5$ and $C_6$, where the two switchable capacitive elements $C_5$ and $C_6$ may be connected in series between the terminals N1 and N3, e.g. the switchable capacitive element $C_5$ may be coupled between the terminal N1 and the switchable capacitive element $C_6$ and the switchable capacitive element $C_6$ may be coupled between the terminal N3 and the switchable capacitive element $C_5$.

According to some embodiments of the present invention, at least one portion (e.g. a portion or all) of the switchable capacitive elements $C_5$ and $C_6$ may be replaced by non-switchable capacitive element(s). For example, in the LC tank of these embodiments, the capacitive element C2 shown in FIG. 3 can be taken as an example of the non-switchable capacitive element(s) described above.

Figure 7:
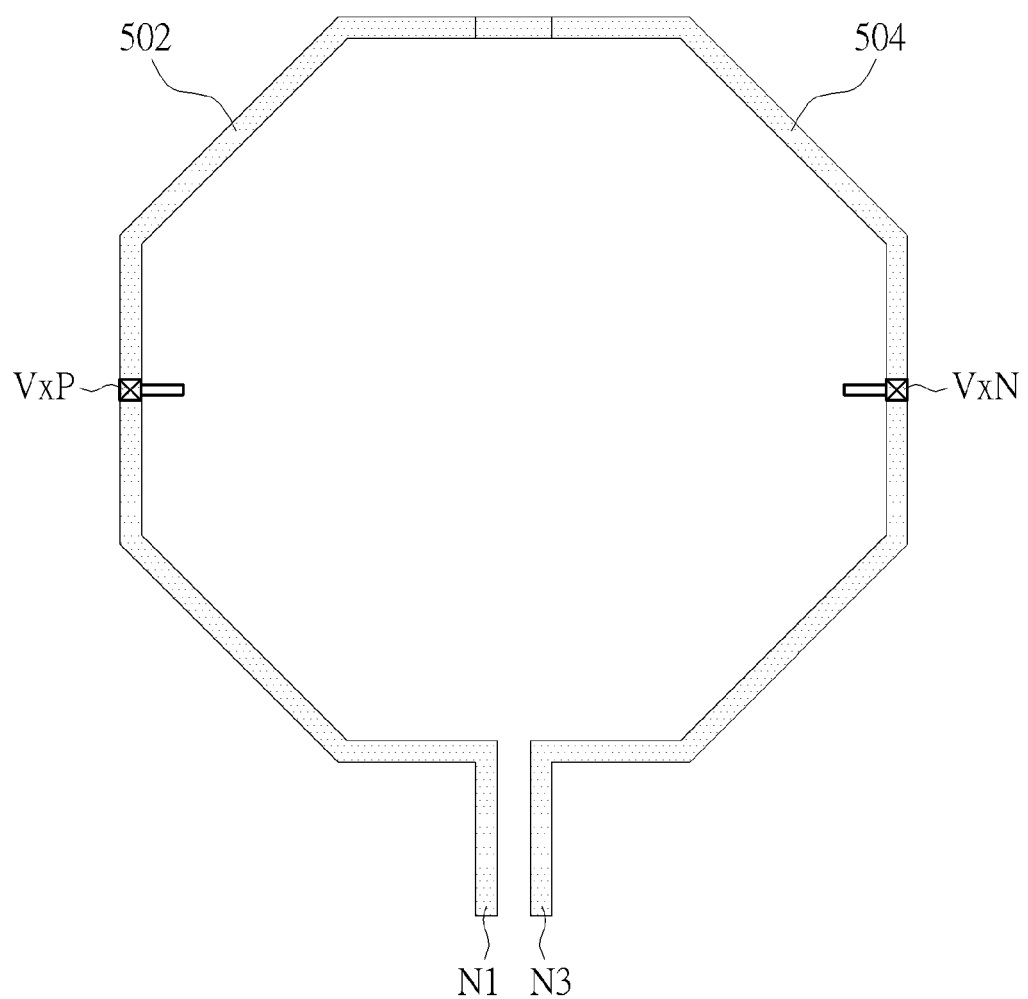
FIG. 7 shows a topology of a portion of the LC tank of the present invention.

FIG. 7 shows a topology of a portion of the LC tank of the present invention. The left half of the coil 502 may represent the inductor LP shown in FIG. 5 and FIG. 6, and the right half of the coil 504 may represent the inductor LN shown in FIG. 5 and FIG. 6. The inductors form an octagonal geometry as a whole. The ports (the terminals N1 and N3) of the inductors are located in the same corner of the octagonal shape. In other embodiments, the inductors may have other polygonal shapes. In more detail, the point V×P is located at the center point on the left coil 502, i.e. the inductor LP, and the left coil 502 is separated into two parts, i.e. the upper inductor $L_1$ and the bottom inductor $L_2$. Note that the upper inductor $L_1$ and the bottom inductor $L_2$ have substantially the same length in FIG. 7, but this is not a limitation of the invention. Similarly, the point V×N is located at the center point on the right coil 504, i.e. the inductor LN, and the right coil 504 is separated into two parts, i.e. the upper inductor $L_3$ and the bottom inductor $L_4$. Note that the upper inductor $L_3$ and the bottom inductor $L_4$ have substantially the same length in FIG. 7, but this is not a limitation of the invention. The two ports and the points V×P and V×N are further connected to capacitors, which are not shown in FIG. 7.

Figure 8:
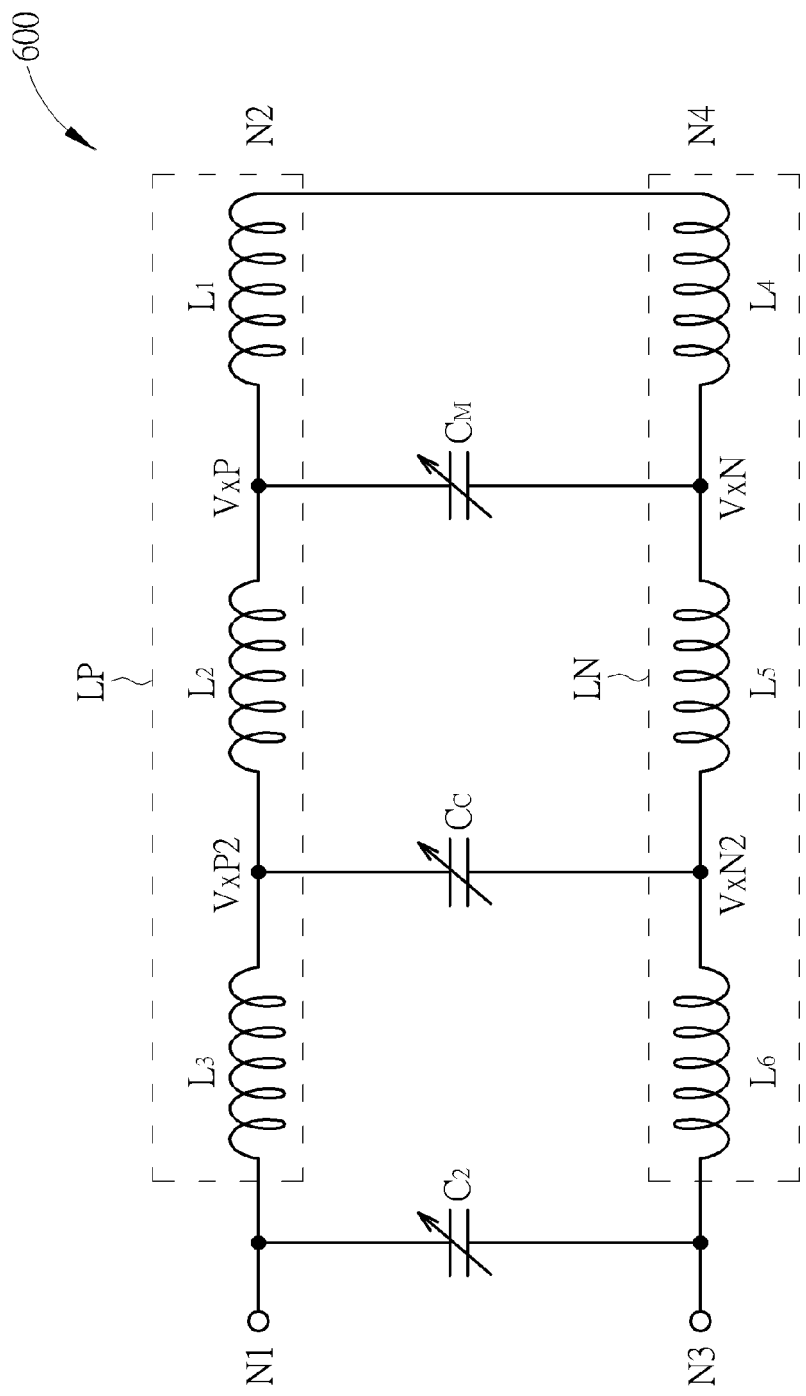
FIG. 8 is a diagram illustrating an LC tank according to a fourth embodiment of the present invention.

FIG. 8 is a diagram illustrating an LC tank according to a fourth embodiment of the present invention. The differential multi-order LC tank 600 comprises two inductors LP and LN and switchable capacitive elements $C_2$, $C_C$ and $C_M$. Specifically, capacitor devices may be placed in each switchable capacitive element $C_2$, $C_C$ and $C_M$. The capacitor devices can be switched on or off via switches depending on a provided data word. Note that the number of devices is not limited in this invention. Moreover, the switchable capacitive elements $C_2$, $C_C$ and $C_M$ may be replaced by analog capacitors in other designs. The switchable capacitive element $C_2$ is coupled between a terminal N1 of the inductor LP and a terminal N3 of the inductor LN. The switchable capacitive element $C_C$ is coupled between a point V×P2 on the inductor LP and a point V×N2 on the inductor LN, wherein the points V×P2 and V×N2 may be arbitrarily selected according to design specifications. The switchable capacitive element $C_M$ is coupled between a point V×P on the inductor LP and a point V×N on the inductor LN, wherein the points V×P and V×N may be arbitrarily selected according to design specifications. The inductor LP is separated into three series sub-inductors $L_1$, $L_2$ and $L_3$ by the points V×P and V×P2, and the inductor LN is separated into three series sub-inductors $L_4$, $L_5$ and $L_6$ by the points V×N and V×N2. Note that an inductance (hereinafter, LP) of the inductor LP equals the sum of the inductances (hereinafter, $L_1$, $L_2$ and $L_3$) of the inductors $L_1$, $L_2$ and $L_3$; and an inductance (hereinafter, LN) of the inductor LN equals the sum of the inductances (hereinafter, $L_4$, $L_5$ and $L_6$) of the inductors $L_4$, $L_5$ and $L_6$. In practice, the points V×P and V×P2 may be any point on the inductor LP other than the terminal N1 and another terminal N2; the points V×N and V×N2 may be any point on the inductor LN other than the terminal N3 and another terminal N4. Preferably, $L_1$ is smaller than a sum of $L_2$ and $L_3$, and $L_4$ is smaller than a sum of $L_5$ and $L_6$; however, $L_1 < L_2 + L_3$ and $L_4 < L_5 + L_6$ is not a limitation of the invention. The terminal N2 is coupled to the terminal N4.

The LC tank 600 is capable of operating with different system standards by controlling the switchable capacitive element $C_2$, although this may be an optional feature in some applications. Hence, the switchable capacitive element $C_2$ is not essential to the invention. The concept of the LC tank 600 is similar to the LC tank 300 except that the LC tank 600 has one more switchable capacitive element. According to equations (2), (4) and Table 1 illustrated above, the switchable capacitive element $C_C$ corresponds to a greater $$\frac{\partial f_{osc}}{\partial C_1} \bigg/ \frac{\partial f_{osc}}{\partial C_2}$$

compared to the switchable capacitive element $C_M$. For example, the $$\frac{\partial f_{osc}}{\partial C_1} \bigg/ \frac{\partial f_{osc}}{\partial C_2},$$

corresponding to the switchable capacitive element $C_C$, is four times greater than the $$\frac{\partial f_{osc}}{\partial C_1} \bigg/ \frac{\partial f_{osc}}{\partial C_2}$$

corresponding to the switchable capacitive element $C_M$ in a certain tuning range. In one example, the switchable capacitive element $C_C$ may be utilized for the calibration process and the switchable capacitive element $C_M$ may be utilized for frequency tuning. Those skilled in the art should readily understand that the calibration result can be easily utilized to model the behavior of the switchable capacitive element $C_M$ by a mapping relationship which can be predicted in advance. In this way, when the LC tank 600 is required to be calibrated for a specific tuning range, the process will be much more efficient by using the switchable capacitive element $C_C$ instead of the switchable capacitive element $C_M$.

In another example, the switchable capacitive element $C_C$ can also be used to jointly tune frequency with the switchable capacitive element $C_M$. For instance, the $$\frac{\partial f_{osc}}{\partial C_1} \bigg/ \frac{\partial f_{osc}}{\partial C_2},$$

corresponding to the switchable capacitive element $C_C$, is $2^k$ times greater than the $$\frac{\partial f_{osc}}{\partial C_1} \bigg/ \frac{\partial f_{osc}}{\partial C_2}$$

corresponding to the switchable capacitive element $C_M$ in a certain tuning range. Then, the $1^{st}$-$k^{th}$ bits of the data word provided to the LC tank 600 may be sent to the switchable capacitive element $C_M$; and the bits greater than the $k^{th}$ bit of the data word may be sent to the switchable capacitive element $C_C$. In this way, both the switchable capacitive element $C_M$ and the switchable capacitive element $C_C$ can be shrunk to a smaller size. In summary, the disclosed LC tank 600 not only has immunity to variations in the manufacturing process, but also has fast calibration ability. Note that the switchable capacitive element $C_C$ may be designed as the switchable capacitive elements $C_3$ and $C_4$ shown in FIG. 6, as can the switchable capacitive elements $C_M$, in order to adjust the LC tank 400 asymmetrically for certain usage, as mentioned above.

Figure 9:
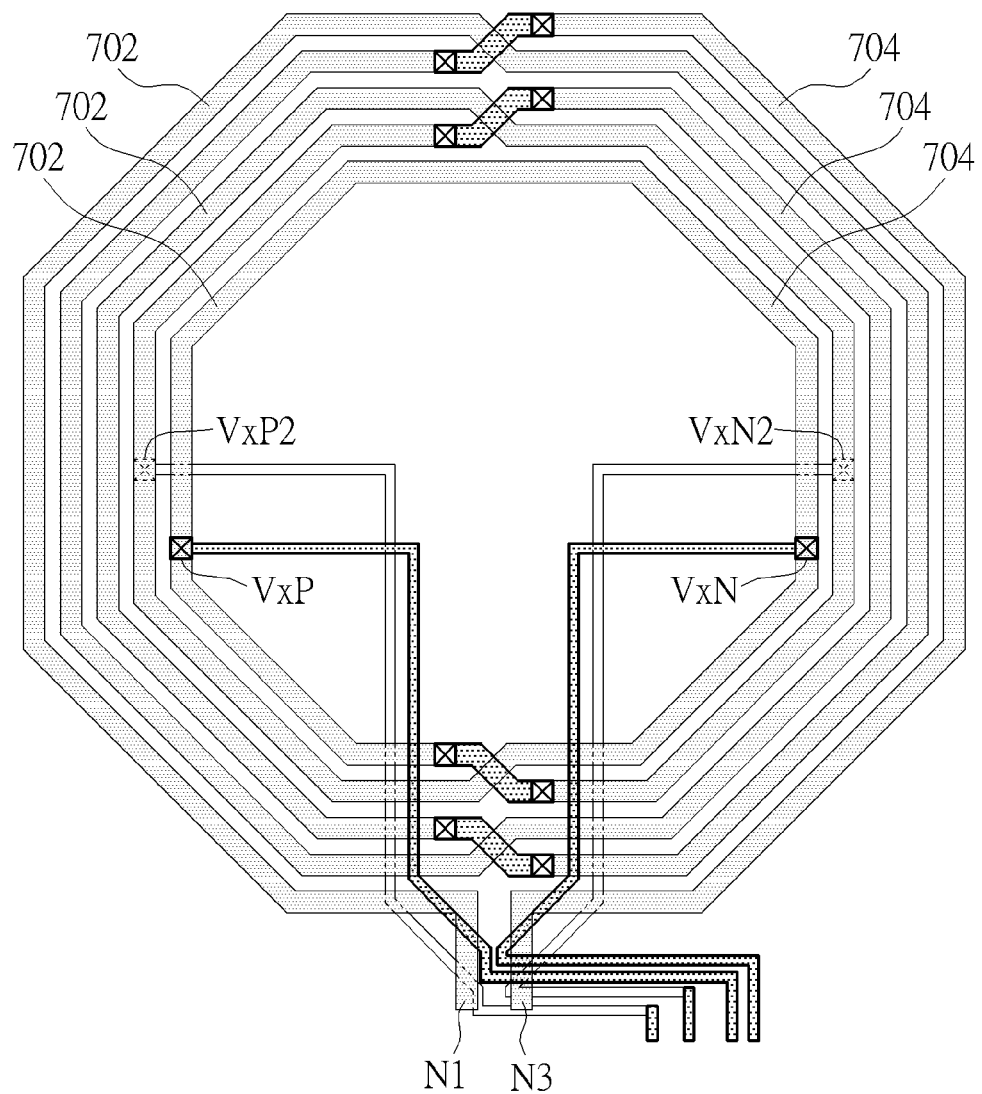
FIG. 9 shows another topology of a portion of the LC tank of the present invention.

FIG. 9 shows another topology of a portion of the LC tank of the present invention. In FIG. 9, a first and a second coupled windings are formed, respectively, by a first spiral coil 702 and a second spiral coil 704 supported by a semiconductor substrate, wherein the first and second coils 702 and 704 are interlaced. The first spiral coil 702 represents the inductor LP shown in FIG. 8, and the second spiral coil 704 represents the inductor LN shown in FIG. 8. The inductors form an octagonal geometry as a whole. The ports (the terminals N1 and N3) of the inductors are located in the same corner of the octagonal shape. In other embodiments, the inductors may have other polygonal shapes. In more detail, the points V×P and V×P2 are located at different points on the first spiral coil 702 corresponding to the inductor LP, and the first spiral coil 702 is separated into three parts, i.e. the inductors $L_1$, $L_2$ and $L_3$. Note that position of the points V×P and V×P2 are not limited in the invention. Similarly, the points V×N and V×N2 are located at different points on the second spiral coil 704 corresponding to the inductor LN, and the inductor LN is separated into three parts, i.e. the inductors $L_4$, $L_5$ and $L_6$. Note that position of the points V×N and V×N2 are not limited in the invention. The two ports and the points V×P, V×P2, V×N and V×N2 are further connected to capacitors, which are not shown in FIG. 9.

Figure 10:
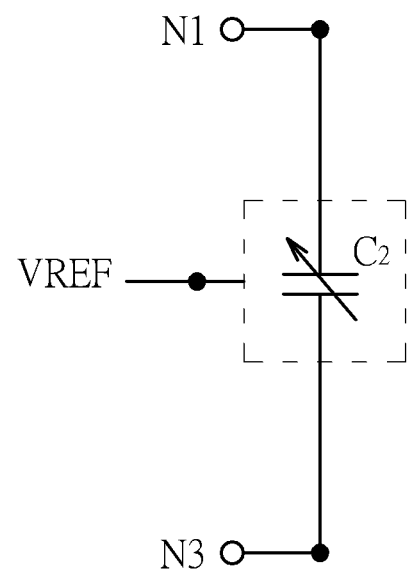
FIG. 10 illustrates some implementation details related to an LC tank according to an embodiment of the present invention.

FIG. 10 illustrates some implementation details related to an LC tank according to an embodiment of the present invention. For example, the switchable capacitive element $C_2$ (such as that in any of the LC tank 300 shown FIG. 5, the LC tank 400 shown FIG. 6, and the LC tank 600 shown FIG. 8) may be implemented as a capacitive element having at least three terminals, wherein a first terminal of the three terminals (e.g. the upper terminal of the switchable capacitive element $C_2$ shown in FIG. 10) is coupled to the terminal N1, a second terminal of the three terminals (e.g. the lower terminal of the switchable capacitive element $C_2$ shown in FIG. 10) is coupled to the terminal N3, and a third terminal of the three terminals (e.g. the left terminal of the switchable capacitive element $C_2$ shown in FIG. 10) is coupled to a reference voltage VREF.

Figure 11:
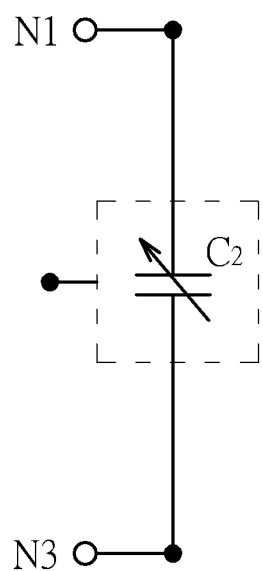
FIG. 11 illustrates some implementation details related to an LC tank according to another embodiment of the present invention.

FIG. 11 illustrates some implementation details related to an LC tank according to another embodiment of the present invention. For example, the switchable capacitive element $C_2$ (such as that in any of the LC tank 300 shown FIG. 5, the LC tank 400 shown FIG. 6, and the LC tank 600 shown FIG. 8) may be implemented as the capacitive element having the three terminals, wherein the first terminal of the three terminals (e.g. the upper terminal of the switchable capacitive element $C_2$ shown in FIG. 11) is coupled to the terminal N1, the second terminal of the three terminals (e.g. the lower terminal of the switchable capacitive element $C_2$ shown in FIG. 11) is coupled to the terminal N3, and the third terminal of the three terminals (e.g. the left terminal of the switchable capacitive element $C_2$ shown in FIG. 11) is left floating.

In particular, it is envisaged that the aforementioned inventive concept can be applied by a semiconductor manufacturer to any integrated circuit. It is further envisaged that, for example, a semiconductor manufacturer may employ the inventive concept in the design of a stand-alone device, or application-specific integrated circuit (ASIC) and/or any other sub-system element.

Although the present invention has been described in connection with some embodiments, it is not intended to be limited to the specific form herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor or controller. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate. In addition, singular references do not exclude a plurality. Thus, references to 'a', 'an', 'first', 'second', etc. do not preclude a plurality.

In light of the above, an improved LC tank for a resonator has been described, wherein the aforementioned disadvantages of prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inductor capacitor (LC) tank, comprising:
a first inductor, having a first terminal and a second terminal; and
a first tunable capacitive array, having a first terminal and a second terminal;
wherein the first tunable capacitive array, comprising a plurality of tunable capacitive units which are independently controllable, is at a path branching from a first point between the first terminal and the second terminal of the first inductor, the first terminal of the first tunable capacitive array is coupled to the first point, and the second terminal of the first tunable capacitive array and the second terminal of the first inductor are coupled to a reference voltage; and
wherein a portion of the first inductor from the second terminal of the first inductor to the first point forms a first sub-inductor, another portion of the first inductor from the first point to the first terminal of the first inductor forms a second sub-inductor, and an inductance of the first sub-inductor is less than an inductance of the second sub-inductor.

2. The LC tank of claim 1, wherein the first inductor is a spiral coil, and a distance from the second terminal of the first inductor to the first point is less than a distance from the first point to the first terminal of the first inductor, wherein the distances are measured along sub-coils of the spiral coil.

3. The LC tank of claim 1, wherein the first tunable capacitive array is controlled by digital signals.

4. The LC tank of claim 1, wherein the first tunable capacitive array is arranged to tune an oscillation frequency of the LC tank.

5. The LC tank of claim 1, further comprising:
a first capacitive element at another path branching from the first terminal of the first inductor, wherein the first capacitive element has a first terminal coupled to the first terminal of the first inductor and a second terminal coupled to the reference voltage or another reference voltage.

6. The LC tank of claim 5, wherein the first inductor is a spiral coil, and a distance from the second terminal of the first inductor to the first point is less than a distance from the first point to the first terminal of the first inductor, wherein the distances are measured along sub-coils of the spiral coil.

7. The LC tank of claim 1, further comprising:
a second tunable capacitive array at another path branching from a second point between the first terminal of the first inductor and the first point, wherein the second tunable capacitive array has a first terminal and a second terminal, the first terminal of the second tunable capacitive array is coupled to the second point, and the second terminal of the second tunable capacitive array is coupled to the reference voltage or another reference voltage.

8. The LC tank of claim 7, wherein the second tunable capacitive array is arranged to perform a calibration process, using a frequency tuning relationship between the first tunable capacitive array and the second tunable capacitive array.

9. The LC tank of claim 7, wherein the second tunable capacitive array is arranged to tune an oscillation frequency of the LC tank.

10. The LC tank of claim 7, wherein a ratio of a differentiation of an oscillation frequency with respect to a capacitance of the second tunable capacitive array to a differentiation of an oscillation frequency with respect to a capacitance of the first tunable capacitive array is a power of 2.

11. The LC tank of claim 1, further comprising:
a second inductor having a first terminal and a second terminal, wherein the second terminal of the second inductor is coupled to the second terminal of the first inductor.

12. The LC tank of claim 11, further comprising:
a second tunable capacitive array at another path branching from a second point between the first terminal and the second terminal of the second inductor, wherein the second tunable capacitive array has a first terminal and a second terminal, the first terminal of the second tunable capacitive array is coupled to the second point, and the second terminal of the second tunable capacitive array is coupled to the reference voltage or another reference voltage.

13. The LC tank of claim 12, wherein the second tunable capacitive array is arranged to tune an oscillation frequency of the LC tank.

14. The LC tank of claim 12, wherein a portion of the second inductor from the second terminal of the second inductor to the second point forms another first sub-inductor, another portion of the second inductor from the second point to the first terminal of the second inductor forms another second sub-inductor, and an inductance of said another first sub-inductor is less than an inductance of said another second sub-inductor.

15. The LC tank of claim 12, wherein the second inductor is a spiral coil, and a distance from the second terminal of the second inductor to the second point is less than a distance from the second point to the first terminal of the second inductor, wherein the distances are measured along sub-coils of the spiral coil.

16. The LC tank of claim 12, further comprising:
a first capacitive element, having three terminals, wherein a first terminal of the three terminals is coupled to the first terminal of the first inductor, a second terminal of the three terminals is coupled to the first terminal of the second inductor, and a third terminal of the three terminals is coupled to yet another reference voltage or left floating.

17. The LC tank of claim 16, wherein a portion of the second inductor from the second terminal of the second inductor to the second point forms another first sub-inductor, another portion of the second inductor from the second point to the first terminal of the second inductor forms another second sub-inductor, and an inductance of said another first sub-inductor is less than an inductance of said another second sub-inductor.

18. The LC tank of claim 16, wherein the second inductor is a spiral coil, and a distance from the second terminal of the second inductor to the second point is less than a distance from the second point to the first terminal of the second inductor, wherein the distances are measured along sub-coils of the spiral coil.

19. The LC tank of claim 12, further comprising:
a third tunable capacitive array at another path branching from a third point between the first terminal of the second inductor and the second point, wherein the third tunable capacitive array has a first terminal and a second terminal, the first terminal of the third tunable capacitive array is coupled to the third point, and the second terminal of the third tunable capacitive array is coupled to the reference voltage.

20. The LC tank of claim 19, wherein the third tunable capacitive array is arranged to perform a calibration process.

21. The LC tank of claim 19, wherein the third tunable capacitive array is arranged to tune an oscillation frequency of the LC tank.

22. The LC tank of claim 19, wherein a ratio of a differentiation of an oscillation frequency with respect to a capacitance of the third tunable capacitive array to a differentiation of an oscillation frequency with respect to a capacitance of the second tunable capacitive array is a power of 2.

23. An inductor capacitor (LC) tank, comprising:
a first inductor, having a first terminal and a second terminal;
a second inductor, having a first terminal and a second terminal, wherein the second terminal of the second inductor and the second terminal of the first inductor are coupled to each other; and
a first tunable capacitive array, having a first terminal and a second terminal, wherein the first tunable capacitive array is at a path branching from a first point between the first terminal and the second terminal of the first inductor to a second point between the first terminal and the second terminal of the second inductor, the first terminal of the first tunable capacitive array is coupled to the first point, and the second terminal of the first tunable capacitive array is coupled to the second point;
wherein a portion of the first inductor from the second terminal of the first inductor to the first point forms a first sub-inductor, another portion of the first inductor from the first point to the first terminal of the first inductor forms a second sub-inductor, and an inductance of the first sub-inductor is less than an inductance of the second sub-inductor; and a portion of the second inductor from the second terminal of the second inductor to the second point forms a third sub-inductor, another portion of the second inductor from the second point to the first terminal of the second inductor forms a fourth sub-inductor, and an inductance of the third sub-inductor is less than an inductance of the fourth sub-inductor.

24. The LC tank of claim 23, further comprising:
a first capacitive element, having a first terminal, a second terminal and a third terminal, wherein the first terminal of the first capacitive element is coupled to the first terminal of the first inductor, the second terminal of the first capacitive element is coupled to the first terminal of the second inductor, and the first capacitive element has the third terminal that is coupled to a reference voltage or left floating.

25. The LC tank of claim 23, wherein the first inductor is a spiral coil, and a first distance from the second terminal of the first inductor to the first point is less than a second distance from the first point to the first terminal of the first inductor, wherein the first distance and the second distance are measured along sub-coils of the spiral coil; and the second inductor is another spiral coil, and a third distance from the second terminal of the second inductor to the second point is less than a fourth distance from the second point to the first terminal of the second inductor, wherein the third distance and the fourth distance are measured along sub-coils of the spiral coil.

26. The LC tank of claim 23, further comprising:
a second tunable capacitive array, having a first terminal and a second terminal, wherein the second tunable capacitive array is at another path branching from a third point between the first point and the first terminal of the first inductor to a fourth point between the second point and the first terminal of the second inductor, the first terminal of the second tunable capacitive array is coupled to the third point, and the second terminal of the second tunable capacitive array is coupled to the fourth point.

27. The LC tank of claim 26, further comprising:
a first capacitive element, having a first terminal, a second terminal and a third terminal, wherein the first terminal of the first capacitive element is coupled to the first terminal of the first inductor, the second terminal of the first capacitive element is coupled to the first terminal of the second inductor, and the first capacitive element has the third terminal that is coupled to a reference voltage or left floating.

28. An inductor capacitor (LC) tank, comprising:
a first inductor, having a first terminal and a second terminal;
a second inductor, having a first terminal and a second terminal, wherein the second terminal of the second inductor and the second terminal of the first inductor are coupled to each other; and a first tunable capacitive array, having a first terminal and a second terminal, wherein the first tunable capacitive array is at a path branching from a first point between the first terminal and the second terminal of the first inductor to a second point between the first terminal and the second terminal of the second inductor, the first terminal of the first tunable capacitive array is coupled to the first point, and the second terminal of the first tunable capacitive array is coupled to the second point;

a second tunable capacitive array, having a first terminal and a second terminal, wherein the second tunable capacitive array is at another path branching from a third point between the first point and the first terminal of the first inductor to a fourth point between the second point and the first terminal of the second inductor, the first terminal of the second tunable capacitive array is coupled to the third point, and the second terminal of the second tunable capacitive array is coupled to the fourth point; and a first capacitive element, having a first terminal, a second terminal and a third terminal, wherein the first terminal of the first capacitive element is coupled to the first terminal of the first inductor, the second terminal of the first capacitive element is coupled to the first terminal of the second inductor, and the first capacitive element has the third terminal that is coupled to a reference voltage or left floating;

wherein a portion of the first inductor from the second terminal of the first inductor to the first point forms a first sub-inductor, another portion of the first inductor from the first point to the third point forms a second sub-inductor, yet another portion of the first inductor from the third point to the first terminal of the first inductor forms a third sub-inductor, and an inductance of the first sub-inductor is less than a summation of an inductance of the second sub-inductor and an inductance of the third sub-inductor; and a portion of the second inductor from the second terminal of the second inductor to the second point forms a fourth sub-inductor, another portion of the second inductor from the second point to the fourth point forms a fifth sub-inductor, yet another portion of the second inductor from the fourth point to the first terminal of the second inductor forms a sixth sub-inductor, and an inductance of the fourth sub-inductor is less than a summation of an inductance of the fifth sub-inductor and an inductance of the sixth sub-inductor.

29. An inductor capacitor (LC) tank, comprising:

a first inductor, having a first terminal and a second terminal;

a second inductor, having a first terminal and a second terminal, wherein the second terminal of the second inductor and the second terminal of the first inductor are coupled to each other; and a first tunable capacitive array, having a first terminal and a second terminal, wherein the first tunable capacitive array is at a path branching from a first point between the first terminal and the second terminal of the first inductor to a second point between the first terminal and the second terminal of the second inductor, the first terminal of the first tunable capacitive array is coupled to the first point, and the second terminal of the first tunable capacitive array is coupled to the second point;

a second tunable capacitive array, having a first terminal and a second terminal, wherein the second tunable capacitive array is at another path branching from a third point between the first point and the first terminal of the first inductor to a fourth point between the second point and the first terminal of the second inductor, the first terminal of the second tunable capacitive array is coupled to the third point, and the second terminal of the second tunable capacitive array is coupled to the fourth point; and a first capacitive element, having a first terminal, a second terminal and a third terminal, wherein the first terminal of the first capacitive element is coupled to the first terminal of the first inductor, the second terminal of the first capacitive element is coupled to the first terminal of the second inductor, and the first capacitive element has the third terminal that is coupled to a reference voltage or left floating;

wherein the first inductor is a spiral coil, and a first distance from the second terminal of the first inductor to the first point is less than a second distance from the first point to the first terminal of the first inductor, wherein the first distance and the second distance are measured along sub-coils of the spiral coil; and the second inductor is the other spiral coil, and a third distance from the second terminal of the second inductor to the second point is less than a fourth distance from the second point to the first terminal of the second inductor, wherein the third distance and the fourth distance are measured along sub-coils of the other spiral coil.

* * * * *